(12) United States Patent
Zhang et al.

(10) Patent No.: US 11,355,716 B2
(45) Date of Patent: Jun. 7, 2022

(54) FLEXIBLE DISPLAY PANEL AND FABRICATING METHOD THEREOF, FLEXIBLE DISPLAY APPARATUS

(71) Applicant: BOE TECHNOLOGY GROUP CO., LTD., Beijing (CN)

(72) Inventors: Ziyu Zhang, Beijing (CN); Tao Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 662 days.

(21) Appl. No.: 16/082,355

(22) PCT Filed: Feb. 24, 2018

(86) PCT No.: PCT/CN2018/077123
§ 371 (c)(1),
(2) Date: Sep. 5, 2018

(87) PCT Pub. No.: WO2019/085349
PCT Pub. Date: May 9, 2019

(65) Prior Publication Data
US 2021/0184139 A1 Jun. 17, 2021

(30) Foreign Application Priority Data
Nov. 1, 2017 (CN) .......................... 201711057833.1

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3276* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 2017/0062760 A1* | 3/2017 | Kim ..................... H01L 27/3276 |
| 2017/0237025 A1 | 8/2017 | Choi et al. |
| 2017/0262109 A1* | 9/2017 | Choi ................... H01L 51/5253 |
| 2017/0278901 A1* | 9/2017 | Kim ..................... H01L 27/3246 |

(Continued)

FOREIGN PATENT DOCUMENTS

| CN | 106449698 A | 2/2017 |
| CN | 106601133 A | 4/2017 |

(Continued)

OTHER PUBLICATIONS

Office Action dated Jul. 1, 2020, issued in counterpart CN Application No. 201711057833.1, with English translation. (17 pages).
Office Action dated Jul. 2, 2021, issued in counterpart EP Application No. 18782292.9, with Extended European Search Report. (9 pages).
Office Action dated Aug. 31, 2021, issued in counterpart JP Application No. 2018-562317, with English translation. (16 pages).

(Continued)

*Primary Examiner* — J. E. Schoenholtz
(74) *Attorney, Agent, or Firm* — WHDA, LLP (57) ABSTRACT

A flexible display panel may include a flexible base substrate. The flexible base substrate may include a bendable region (2). The flexible display panel may further include a first layer on the flexible base substrate; a trench (26) penetrating at least part of the first layer; a second layer (14) in the trench; and a metal layer (24) on the second layer. The second layer may have a smaller elastic modulus than the first layer. At least part of the second layer and the metal layer may be conformal with the bendable region during bending of the bendable region.

17 Claims, 6 Drawing Sheets

(56) References Cited

U.S. PATENT DOCUMENTS

| | | | |
|---|---|---|---|
| 2017/0287936 A1* | 10/2017 | Kim | H01L 27/1218 |
| 2017/0288007 A1 | 10/2017 | Shin et al. | |
| 2017/0309651 A1 | 10/2017 | Kim et al. | |
| 2017/0317299 A1* | 11/2017 | Choi | H01L 51/5253 |
| 2018/0053906 A1* | 2/2018 | Lee | H01L 51/5253 |
| 2018/0102399 A1* | 4/2018 | Cho | H01L 27/3276 |
| 2018/0286938 A1* | 10/2018 | Moon | H01L 51/0097 |
| 2018/0342707 A1* | 11/2018 | Lee | H01L 27/3258 |
| 2018/0366586 A1* | 12/2018 | Son | H01L 27/3276 |
| 2019/0012031 A1* | 1/2019 | Kim | H01L 51/5203 |
| 2019/0041915 A1* | 2/2019 | Park | H01L 27/124 |
| 2019/0372032 A1* | 12/2019 | Kaneko | G02F 1/1333 |
| 2020/0119131 A1* | 4/2020 | Ohara | H01L 51/50 |
| 2020/0243782 A1* | 7/2020 | Maruyama | H01L 51/003 |

FOREIGN PATENT DOCUMENTS

| | | |
|---|---|---|
| CN | 106784377 A | 5/2017 |
| CN | 106972030 A | 7/2017 |
| CN | 107086236 A | 8/2017 |
| CN | 107241465 A | 10/2017 |
| JP | 2017-111184 A | 6/2017 |
| JP | 2017-187580 A | 10/2017 |

OTHER PUBLICATIONS

International Search Report dated Jun. 29, 2018, issued in counterpart International Application No. PCT/CN2018/077123. (9 pages).
Office Action dated Mar. 29, 2022, issued in counterpart JP application No. 2018-562317, with English translation. (14 pages).

* cited by examiner

FLEXIBLE DISPLAY PANEL AND FABRICATING METHOD THEREOF, FLEXIBLE DISPLAY APPARATUS

CROSS-REFERENCE TO RELATED APPLICATIONS

This application claims benefit of the filing date of Chinese Patent Application No. 201711057833.1 filed on Nov. 1, 2017, the disclosure of which is hereby incorporated by reference.

TECHNICAL FIELD

This disclosure relates to flexible display technology, and more particularly, to a flexible display panel, a fabrication method thereof and a flexible display apparatus.

BACKGROUND

Since an Organic Light-Emitting Diode (OLED) display is a self-luminescent display through an organic layer, the OLED display needs neither a backlight, nor the optical characteristics of liquid crystals. Accordingly, the OLED display has advantages such as faster response time, larger viewing angle, higher contrast, lighter weight, and lower power consumption. The OLED display is considered as the most promising flat panel display and at the same time the most likely to be made into a flexible display. At present, the flexible active-matrix organic light emitting diode (AMO-LED) display panel has become the mainstream configuration and development direction for high-end mobile display devices.

BRIEF SUMMARY

Accordingly, one example of the present disclosure is a flexible display panel. The flexible display panel may include a flexible base substrate, the flexible base substrate comprising a bendable region; a first layer on the flexible base substrate; a trench penetrating at least part of the first layer; a second layer in the trench; and a metal layer on the second layer. The second layer may have a smaller elastic modulus than the first layer. At least part of the second layer and the metal layer may be conformal with the bendable region during bending of the bendable region.

The first layer may comprise an isolation layer. the second layer may comprise a polymer layer. The metal layer may be a lead wire. The bendable region may be a bending region. Orthographic projection of the trench on the flexible base substrate may overlap the bendable region of the flexible base substrate. The trench may be in a non-display region of the flexible display panel.

The flexible display panel may further comprise a display region. The display region may be provided with an array of sub-pixels and signal lines, and the non-display region may be provided with a driving chip.

The trench may include a bottom surface, and a first side surface and a second side surface located on both sides of the bottom surface respectively and connected to the bottom surface. A thickness of the second layer in a direction perpendicular to the flexible base substrate may be substantially equal to a depth of the trench. In another embodiment, a thickness of the second layer in a direction perpendicular to the flexible base substrate may be lower than a depth of the trench. Each of the first side surface and the second side surface may be a slope surface, and an angle of the slope surface may be less than 90 degrees. In another embodiment, each of the first side surface and the second side surface may comprise two sloped surfaces and a step surface between the two sloped surfaces, and an angle of each of the two sloped surfaces may be less than 90 degrees.

The second layer may be made from at least one material selected from the group consisting of polymethylmethacrylate, polydimethylsiloxane, polymethacrylate, polyimide, polyethylene terephthalate, photoresist, and mixtures thereof. Thin film transistors are located in the array of the sub-pixels and each of the thin film transistors may include an isolation buffer layer, an active layer, a first gate insulation layer, a first gate layer, a second gate insulation layer, a second gate layer, a dielectric layer, a source/drain metal layer, and a planarization layer. The first layer may include at least one or more layers from the group consisting of the dielectric layer, the second gate insulating layer, the first gate insulating layer, the isolation buffer layer that cover the non-display region, and mixtures thereof. The metal layer and the source/drain metal layer may be the same material. The second layer and the planarization layer may be the same material.

Another example of the present disclosure is a method for fabricating a flexible display panel. The method may comprise providing a flexible base substrate, the flexible base substrate comprising a bendable region; forming an first layer on the flexible base substrate; forming a trench penetrating at least part of the first layer; filling a second layer in the trench; and forming a metal layer on the second layer. The second layer may have a smaller elastic modulus than the first layer. At least part of the second layer and the third layer may be conformal with the bendable region during bending of the bendable region. The second layer may be formed by an inkjet printing process.

Another example of the present disclosure is a display apparatus comprising a flexible display panel according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7. When referring to the figures, like structures and elements shown throughout are indicated with like reference numerals.

In addition, the drawings are merely schematic representations of the present disclosure and are not necessarily drawn to scale. Some of the block diagrams shown in the figures are functional entities and do not necessarily correspond to physically or logically separate entities. These functional entities may be implemented in software form or implemented in one or more hardware modules or integrated circuits or implemented in different networks and/or processor devices and/or microcontroller devices.

In this specification, the terms "first" and "second" may be added as prefixes. These prefixes, however, are only added in order to distinguish the terms and do not have specific meaning such as order and relative merits.

A mobile display apparatus usually requires a high proportion of the screen and a narrow frame in the front. Thus, while a flexible base substrate in a display panel is made to reduce the frame, at the same time, a driving chip and a lead wire on the flexible base substrate need to be folded to the back of the screen to improve the proportion of the display region in the front. During the folding process, because the lead wire is in an outside layer, the lead wire is usually subjected to high tensile stress, thereby increasing the risk of wire breakage.

Figure 2:
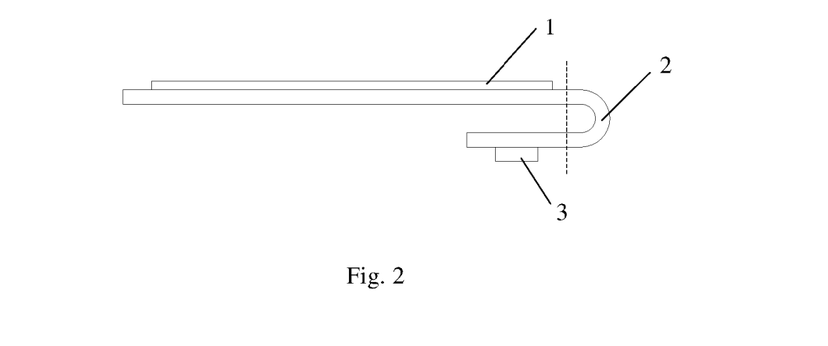
FIG. 2 is a side view of a flexible display panel after folding according to one embodiment of the present disclosure.
Figure 3:
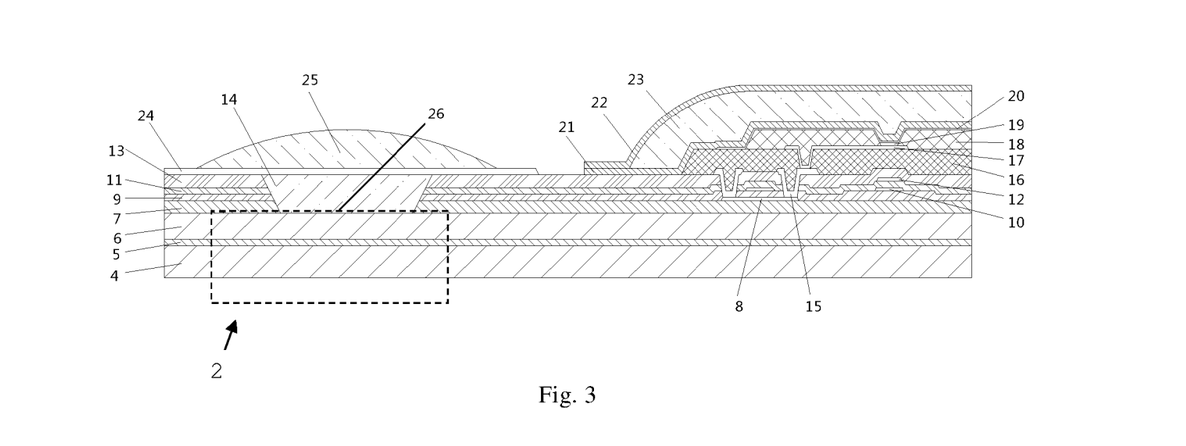
FIG. 3 shows a schematic diagram of a flexible display panel according to one embodiment of the present disclosure.
Figure 4:
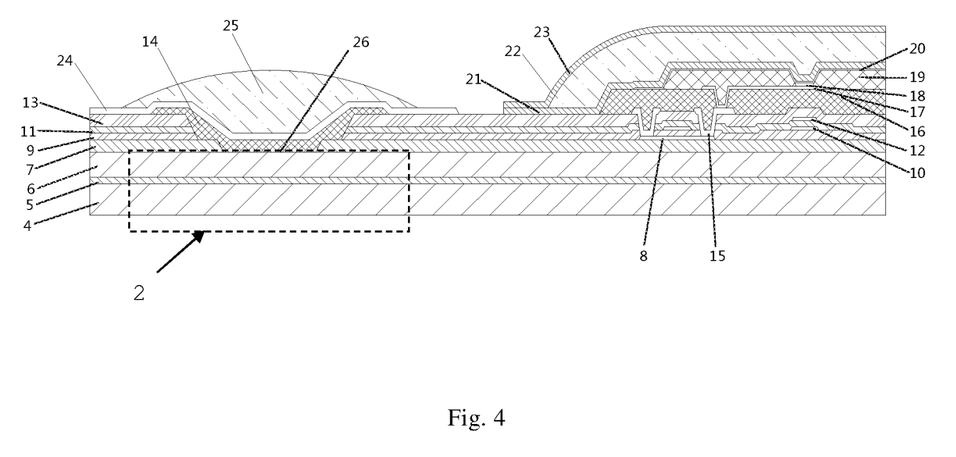
FIG. 4 shows a schematic diagram of a flexible display panel according to one embodiment of the present disclosure.

One example of the present disclosure is a flexible display panel. The flexible display panel may include a flexible base substrate. The flexible base substrate may include a bendable region. In one embodiment, the bendable region is flat, as shown in FIGS. 3 and 4. In another embodiment, the bendable region is bent, as shown in FIG. 2. The term "bendable region" as used herein means that one end of the flexible base substrate can be bent at the bendable region at least 90 degree relative to the other end of the flexible base substrate. In one embodiment, one end of the flexible base substrate can be bent at the bendable region approximately 180 degree relative to the other end of the flexible base substrate. That is, the flexible base substrate can be folded at the bendable region, as shown in FIG. 2.

The flexible display panel may further include a first layer on the flexible base substrate; a trench penetrating at least part of the first layer; a second layer in the trench; and a metal layer on the second layer. The second layer may have a smaller elastic modulus than the first layer. At least part of the second layer and the metal layer may be conformal with the bendable region during bending of the bendable region. That is, before bending of the bendable region, at least part of the second layer and the third layer has conformal shape with the bendable region. Furthermore, during bending of the bendable region, at least part of the second layer and the third layer maintains the conformal shape with the bendable region. Orthographic projection of the trench on the flexible base substrate may overlap the bendable region of the flexible base substrate.

The first layer may include an isolation layer. The second layer may include a polymer layer. The metal layer may be a lead wire. The bendable region may be a bending region. The trench may be in a position corresponding to the bendable region of the flexible base substrate. The trench may also be in a display region or a non-display region of the flexible display panel. The display region may be provided with an array of sub-pixels and signal lines. The non-display region may be provided with a driving chip.

In one embodiment, the flexible display panel includes a flexible base substrate. The flexible base substrate includes a bending region, and a display region and a non-display region on both sides of the bending region respectively. The display region is provided with an array of sub-pixels and signal lines. The non-display region is provided with a driving chip. The flexible display panel further includes a first layer, which is an isolation insulating layer disposed on the flexible base substrate; a trench located in the bending region and penetrating at least part of the first layer, the isolation insulating layer; a second layer, which is a first buffer layer filled in the trench; a metal layer which is a lead wire disposed on the isolation insulating layer of the non-display region and the first buffer layer for realizing electrical connection between the driving chip and the signal lines; and a second buffer layer on the lead wire and covering at least the bending region. The isolation insulating layer may include a plurality of layers. In one embodiment, the trench may penetrate only one or several layers of the plurality of layers within the isolation insulating layer.

In the flexible display panel provided according to one embodiment of the present invention, the first buffer layer is disposed under the lead wire and the second buffer layer is disposed on the lead wire. Thus, on the one hand, the first buffer layer and the second buffer layer can adjust stress distribution in the bending region, thereby reducing stress on the lead wire and improving folding performance. On the other hand, the first buffer layer is not easily cracked, thereby reducing the risk of wire breakage. The second buffer layer can protect the lead wire from corrosion of external environment so as to prolong service life of the display panel. The second buffer layer also serves to prevent the lead wire from being disturbed by outside signals, thereby making signals received by the display apparatus more stable.

Figure 1:
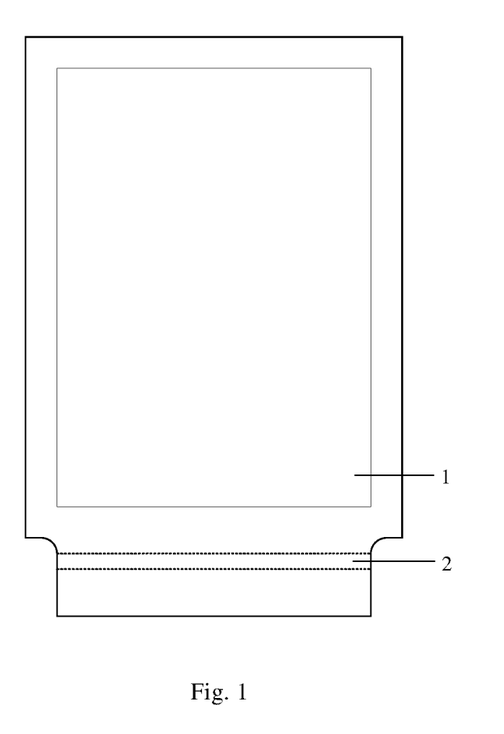
FIG. 1 shows a schematic diagram of a flexible display panel according to one embodiment of the present disclosure

The flexible display panel provided in the embodiments of the present invention is described in detail below with reference to the accompanying drawings:

FIG. 1 shows a schematic diagram of a flexible display panel according to one embodiment of the present disclosure. As shown in FIG. 1, the flexible display panel may include a flexible base substrate and a lead wire. The flexible base substrate may include a display region 1 and a non-display region 3 including a bending region 2. The display region 1 may include an array of sub-pixels and signal lines. The non-display region 2 may include a driving chip. In another embodiment, the bending region 2 may be located in the display region 1.

The lead wire is located in the bending region 2 and the non-display region 3 and can be used for connecting the driving chip and the signal lines. The driving chip can provide the driving signals for the display region 1.

The flexible base substrate can be folded in a small radius along the bending region 2, and accordingly, the driving chip can be placed on the back surface of the display region to reduce width of the lower border.

FIG. 2 is a side view of a flexible display panel after folding according to one embodiment of the present disclosure. As shown in FIG. 2, the folded side view shows that the driving chip can be folded along with the flexible base substrate to the back of the display region.

FIG. 3 shows a schematic structural view of a flexible display panel according to one embodiment of the present disclosure. As shown in FIG. 3, the flexible base substrate may be a three-layer structure in which an inorganic layer 5 is sandwiched between two organic layers 4 and 6. The thin film transistors in the array of sub-pixels disposed on the flexible base substrate may include an isolation buffer layer 7, an active layer 8, a first gate insulation layer 9, a first gate layer 10, and a second gate insulation layer 11, a second gate layer 12, a dielectric layer 13, a source/drain metal layer 15, and a planarization layer 16 in this order. This is a double-gate structure. In the case of the double-gate structure, the isolation insulating layer includes the dielectric layer 13, the second gate insulating layer 11, the first gate insulating layer 9, and the isolation buffer layer 7, all of which cover the non-display region. In another embodiment, the thin film transistors in the array of sub-pixels may also include an isolation buffer layer, an active layer, a gate insulating layer, a gate layer, a dielectric layer, a source/drain metal layer, and a planarization layer in this order. This is a single gate structure. In the case of the single-gate structure, the isolation insulating layer includes the dielectric layer, the gate insulating layer, and the isolation buffer layer, all of which cover the non-display region.

The sub-pixel may further include a display unit. The display unit may include a pixel electrode 17, an organic light-emitting layer 19, and a cathode 20. The organic light-emitting layer 19 may be spaced by a pixel definition layer 18, which may be an organic material. The sub-pixel may be provided with an encapsulation layer. The encapsulation layer may be a multi-layer structure, and may include an inorganic layer 21, an inorganic layer 22 and an organic layer 23. The organic layer 23 may be surrounded by the inorganic layer 21 and the inorganic layer 22. The border of the inorganic layer should be larger than the border of the organic layer in order to provide a good edge water barrier. A flexible OLED display package is generally in a thin film encapsulation form, the basic structure thereof includes two inorganic waterproof layers sandwiching an organic layer for stress relaxation. The organic layer is usually prepared by an inkjet printing process. During the inkjet printing process, liquid organic materials can be programmed and printed to designated locations, then cured and leveled to form a flat organic thin film.

The isolation buffer layer 7 on the surface of the flexible base substrate can be an isolation layer and a buffer layer. The isolation buffer layer 7 can be made of inorganic materials such as $SiO_x$, $SiN_x$, SiON, $Al_2O_3$ and the like. The isolation buffer layer 7 can prevent water vapor from entering the device from the bottom of the base substrate and simultaneously prevent leaked impurity atoms from entering the sub-pixel array to form doping.

The trench 26 may include a bottom surface and first and second side surfaces located on both sides of the bottom surface respectively and connected to the bottom surface. The thickness of the first buffer layer in the trench in a direction perpendicular to the base substrate may be equal to or slightly higher than the depth of the trench. The thickness of the first buffer layer may also be lower than the depth of the trench. The two side surfaces of the trench can be sloped or stepped. Of course, other shapes of the side surfaces are possible, and all shapes of the trench that are convenient for filling the first buffer layer are within the protection scope of the present invention, which is not limited herein. When the two side surfaces of the trench are sloped surfaces, the filling of the first buffer layer can be facilitated and the bonding is good. When each of the side surfaces of the trench is a stepped side surface comprising two sloped surfaces and a step surface between the two sloped surfaces, the first buffer layer can be filled to the level of the step surface to increase the length of the lead wire, thereby reducing the risk of wire breakage.

The trench can be made by an etching process, for example, one-step etching or step-wise etching. Of course, the trench can also be made by other processes, which is not limited herein.

In one embodiment, the trench is obtained by one-step etching. In the bending region, the dielectric layer, the second gate insulating layer, the first gate insulating layer, the isolation layer, and the buffer layer that extend to the non-display region can be etched in one step. The etching width can be within a range of 1 mm to 5 mm, the etching depth can be made until the organic layer of the base substrate, and an angle of the slope are less than 90 degrees. The angle of the slope is herein defined as the angle formed between the slope surface and the top surface of the base substrate outside the trench. This shape of the trench facilitates filling of the first buffer layer and has good bonding. The etching process can be dry etching, and the dry etching gas can be $CF_4/SF_6/NF_3/CH_2F_2/CHF_3$ and so on.

The first buffer layer 14 is filled in the trench. The thickness of the first buffer layer in the direction perpendicular to the base substrate may be equal to or slightly higher than the depth of the trench so as to just level the trench. The thickness of the first buffer layer can be within a range of 1 um to 3 um. The lead wire can be deposited smoothly on the channels caused by the flat etching, thereby avoiding wire breakage.

The first buffer layer can be prepared by an inkjet printing process. During the preparation process, the liquid organic material can be programed and printed to the designated location, then cured and leveled. This process has advantages such as a large adjustable thickness range and a good leveling effect, and can effectively fill the etching channels. Furthermore, in the region of point coating, the rate of material utilization is high. Furthermore, the process is simple, and there is no need for custom mask and development, thereby significantly reducing the cost of the process. The first buffer layer may be organic material, such as at least one or more selected from the group consisting of polymethylmethacrylate, polydimethylsiloxane, polymethacrylate, polyimide, polyethylene terephthalate, photoresists, or other organic substances, which are not limited herein. After the etching and filling steps are completed, the lead wires 24 may be prepared on the first buffer layer. The lead wire may be formed by the same process as the source/drain electrodes 15. The lead wire can be a pad metal lead wire, which can be formed by vapor deposition.

A second buffer layer 25 may be covered at the top of the bending region by an inkjet printing process. The second buffer layer may have a thickness of 2 um to 30 um. The width of the second buffer layer may be slightly larger than that of the bending region in the direction parallel to the base substrate, but does not affect the wire bonding region. The second buffer layer 25 may be made with the organic layer 23 of the encapsulation layer in the same process simultaneously. The second buffer layer may be organic material, such as at least one or more selected from the group consisting of polymethylmethacrylate, polydimethylsiloxane, polymethacrylate, polyimide, polyethylene terephthalate, photoresists, or other organic substances, which are not limited herein. The second buffer layer can be prepared simultaneously with the thin organic layer of the film encapsulation layer without adding any custom processes and components. The organic material can be printed using an inkjet printing program to specified locations to control the location, size, and thickness of the second buffer layer, thereby decreasing cost of the very limited materials.

FIG. 4 shows a schematic structural view of a flexible display panel according to one embodiment of the present disclosure. As shown in FIG. 4, the trench can be prepared using step-wise etching. In the bending region, the dielectric layer, the second gate insulating layer, the first gate insulating layer, the isolation layer, and the buffer layer, which extend to the non-display region, may be etched in two steps. The first step is to etch the dielectric layer, the second gate insulating layer, and the first gate insulating layer into a wider region. The second step is to etch the isolation layer and the buffer layer into a relatively narrower region, forming a gentle step. The angle of the sloped side surfaces may be less than 90 degrees, and the etching width may be within a range of 1 mm to 5 mm. The etching process can be dry etching, and the dry etching gas can be $CF_4/SF_6/NF_3/CH_2F_2/CHF_3$ and so on.

In one embodiment, the first buffer layer 14 is filled in the trench. The thickness of the first buffer layer in a direction perpendicular to the base substrate may be lower than the depth of the trench. The thickness of the first buffer layer may be within a range of 0.5 um to 2 um. The first buffer layer 14 can adopt the same process as the planarization layer 16 or the pixel defining layer 18 in the thin film transistor (TFT) process. Using a spin-on process and steps of exposure and development, the organic material is filled between the gentle steps. This method requires two additional steps of exposure and development, and the first buffer layer is relatively thin. But this method can be easily combined with the current TFT technology, and reduce substrate handling in the existing production line, thereby reducing defects. The first buffer layer may be a stepped structure, which increases the length of the lead wire deposited thereon, thereby reducing the risk of wire breakage. The first buffer layer may be disposed in the same layer as the planarization layer or in the same layer as the pixel defining layer.

After the etching and filling steps are completed, the lead wire 24 may be prepared on the first buffer layer. The lead wire may be formed by the same process as the source/drain electrodes 15. The lead wires can be pad metal lead wires, which can be formed by vapor deposition.

A second buffer layer 25 may be covered at the top of the bending region by an inkjet printing process. The second buffer layer may have a thickness of 2 um to 30 um. The width of the second buffer layer may be slightly larger than that of the bending region in the direction parallel to the base substrate, but does not affect the wire bonding region. The second buffer layer 25 may be made with the organic layer 23 of the encapsulation layer in the same process simultaneously. The second buffer layer may be organic material, such as at least one or more selected from the group consisting of polymethylmethacrylate, polydimethylsiloxane, polymethacrylate, polyimide, polyethylene terephthalate one or more photoresists, or other organic substances, which are not limited herein. The second buffer layer can be prepared simultaneously with the thin film encapsulation (TFE) organic layer without adding any custom processes and components. The organic material can be printed using an inkjet printing program to specified locations to control the location, size, and thickness of the second buffer layer, thereby decreasing cost of the very limited material.

Another example of the present disclosure is a method for fabricating a flexible display panel. The method may include providing a flexible base substrate; forming an first layer on the flexible base substrate; forming a trench penetrating at least part of the first layer; filling a second layer in the trench; and forming a metal layer on the second layer. The flexible base substrate may include a bendable region. The second layer may have a smaller elastic modulus than the first layer. At least part of the second layer and the third layer may be conformal with the bendable region during bending of the bendable region.

Figure 5:
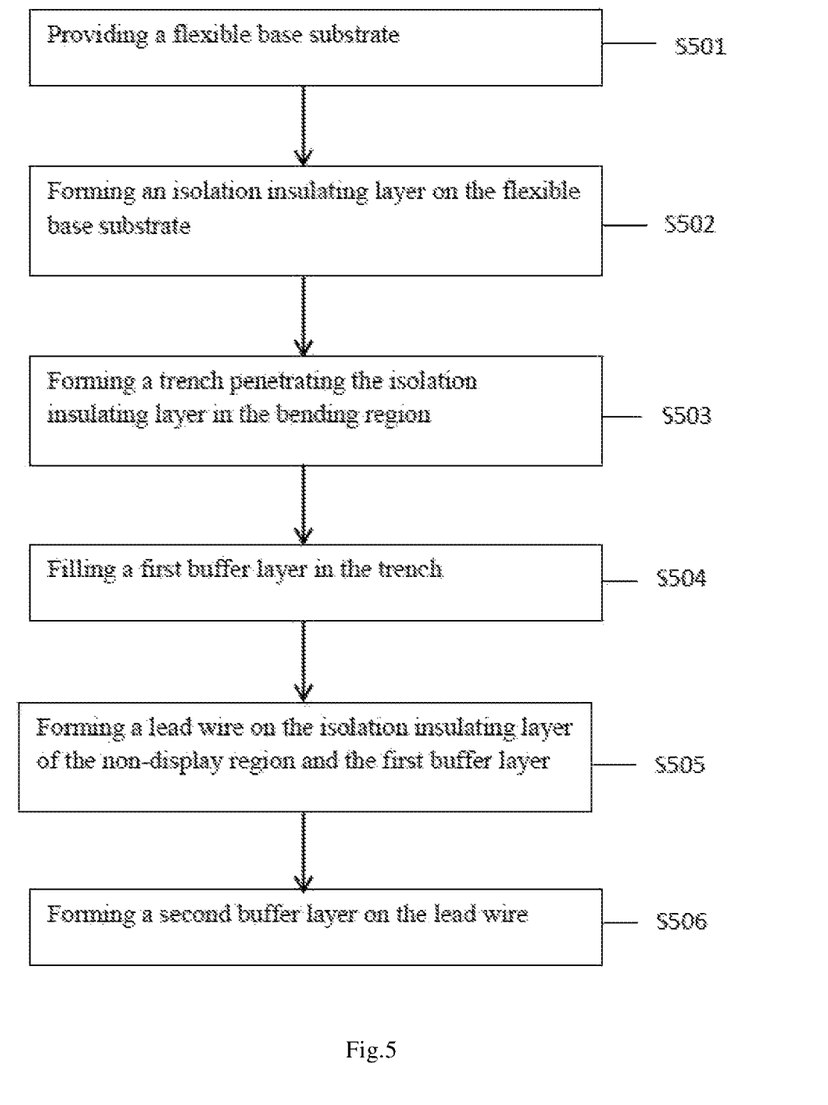
FIG. 5 is a flow chart of a method for fabricating a flexible display panel according to one embodiment of the present disclosure.

FIG. 5 is a flow chart of a method for fabricating a flexible display panel according to one embodiment of the present disclosure. The method includes the following steps:

In step S501, a flexible base substrate is provided. The flexible base substrate may comprise a bending region and a display region and a non-display region on both sides of the bending region respectively. The display region is provided with an array of sub-pixels and signal lines, and the non-display region is provided with a driving chip.

In step S502, a first layer or an isolation insulating layer is formed on the flexible base substrate.

In step S503, a trench penetrating the isolation insulating layer in the bending region is formed. The trench may be formed by one step etching or step-wise etching of the isolation insulating layer of the bending region.

In step S504, a second layer or a first buffer layer is filled in the trench. The first buffer layer can be formed by an ink-jet printing process. During the process, liquid organic material can be programed and printed to specified locations, then cured and leveled. This process has advantages such as excellent leveling performance and large adjustable range of thickness. This process also can improve the leveling performance as well as decrease cost. In one embodiment, the first buffer layer 14 can adopt the same process as the planarization layer 16 or the pixel defining layer 18 in the TFT process. Using a spin-on process and steps of exposure and development, the organic material is filled between the gentle steps. The thickness of the first buffer layer may be within a range of 0.5 μm~2 μm. This method requires the two additional steps of exposure and development. The first buffer layer is relatively thin and flat. But this method can be easily combined with the current TFT technology, and can reduce substrate handling in the existing production line, thereby reducing defects.

In Step S505, a metal layer or a lead wire is formed on the isolation insulating layer of the non-display region and the first buffer layer, wherein the lead wire is used for realizing the electrical connection between the driving chip and the signal lines.

In step S506, a second buffer layer is formed on the lead wire, and the second buffer layer covers at least the bending region. The second buffer layer can be formed by an ink-jet printing process. During the process, liquid organic material can be programed and printed to specified locations, then cured and leveled. This process can control the location, size, and thickness of the second buffer layer, thereby decreasing cost of the very limited material.

In the embodiment of the present disclosure, the isolation insulating layer in the bending region is removed and the first buffer layer is filled in the trench to increase the flexibility of the bending region to effectively prevent generation and growth of cracks in the film layers caused by the bending of a small radius. Furthermore, the lead wire is covered with the second buffer layer. As such, the lead wire can be protected from being corroded by external environment, thereby prolonging service life of the display panel. The lead wire can also be prevented from being interfered with by external signals so that the signals received by the display device are more stable.

Figure 6:
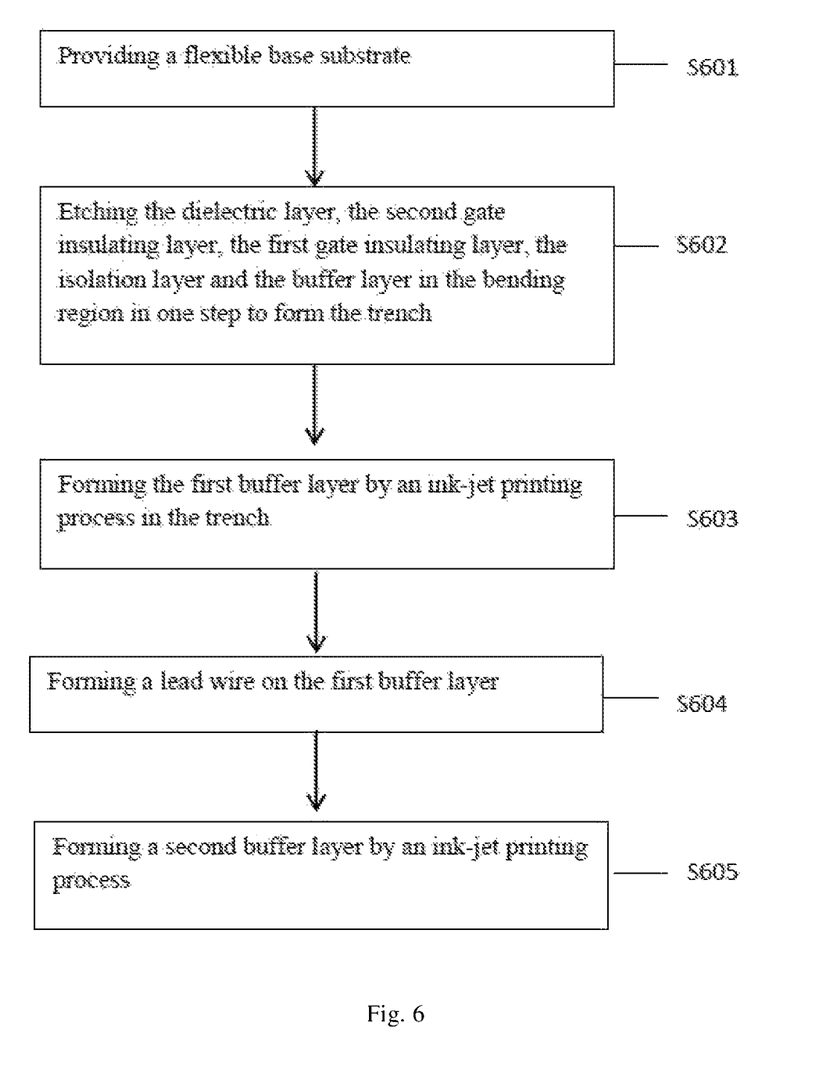
FIG. 6 is a flow chart of a method for fabricating a flexible display panel according to one embodiment of the present disclosure.

FIG. 6 is a flow chart of a method for fabricating a flexible display panel according to one embodiment of the present disclosure. The method includes the following steps:

In step S601, a flexible base substrate is provided.

In step S602, the dielectric layer, the second gate insulating layer, the first gate insulating layer, the isolation layer, and the buffer layer in the bending region are etched in one step to form the trench.

In step S603, the first buffer layer is formed by an ink-jet printing process. During the process, liquid organic materials can be programmed and printed to specified locations, then cured and leveled to fill the trench.

In step S604, a lead wire is prepared on the first buffer layer. The lead wire can be formed by the same process as the source/drain electrode.

In step S605, the second buffer layer is formed by an ink-jet printing process. The second buffer layer 25 may be made with the organic layer 23 in the same process simultaneously.

The procedure of this embodiment has been described in detail in Embodiment 1, and details are not described herein again.

Figure 7:
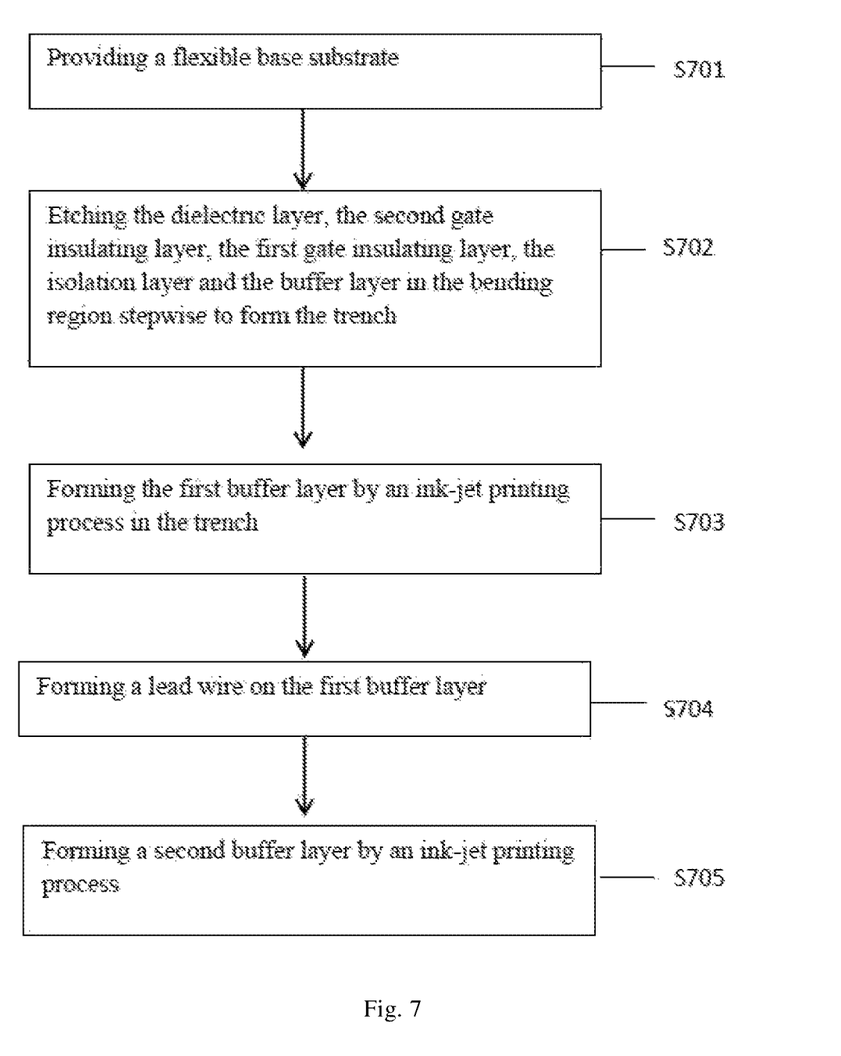
FIG. 7 is a flow chart of a method for fabricating a flexible display panel according to one embodiment of the present disclosure.

FIG. 7 is a flow chart of a method for preparing a flexible display panel according to one embodiment of the present disclosure. The method includes the following steps:

In step S701, a flexible base substrate is provided.

In step S702, the dielectric layer, the second gate insulating layer, the first gate insulating layer, the isolation layer, and the buffer layer in the bending region are etched stepwise to form the trench.

In step S703, the first buffer layer is formed by an ink-jet printing process to fill the trench. The first buffer layer may be disposed in the same layer as the planarization layer or the pixel defining layer.

In step S704, a lead wire is prepared on the first buffer layer. The lead wire can be formed by the same process as the source/drain electrode.

In step S705, the second buffer layer is formed by an ink-jet printing process. The second buffer layer 25 may be made with the organic layer 23 in the same process simultaneously.

The procedure of this embodiment has been described in detail in Embodiment 2, and details are not described herein again.

Another embodiment of the present disclosure is a display apparatus. The display apparatus includes a flexible display panel according to one embodiment of the present disclosure. The display apparatus may be any bendable mobile terminals such as a mobile phone, a tablet personal computer, a laptop computer, a personal digital assistant (PDA), a mobile internet device (MID), or a wearable device.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A flexible display panel, comprising:
   a flexible base substrate, the flexible base substrate comprising a bendable region;
   a first layer on the flexible base substrate;
   a trench penetrating at least part of the first layer;
   a second layer in the trench; and
   a metal layer on the second layer and the first layer;
   wherein the second layer has a smaller elastic modulus than the first layer;
   the trench includes a bottom surface, and a first side surface and a second side surface located on both sides of the bottom surface respectively and connected to the bottom surface;
   each of the first side surface and the second side surface comprises two sloped surfaces and a step surface between the two sloped surfaces, and an angle of each of the two sloped surfaces is less than 90 degrees; and
   the second layer covers the two sloped surfaces and the step surface to form a smooth side surface without a step in the trench, and the metal layer covers the smooth side surface in the trench.

2. The flexible display panel according to claim 1, further comprising a buffer layer, wherein the buffer layer covers the metal layer on the second layer and a portion of the metal layer on the first layer, the portion of the metal layer on the first layer is adjacent to the metal layer on the first layer, and the buffer layer does not fully cover the metal layer on the first layer.

3. The flexible display panel according to claim 1, wherein the first layer comprises an isolation layer.

4. The flexible display panel according to claim 1, wherein the second layer comprises a polymer layer.

5. The flexible display panel according to claim 1, wherein the metal layer is a lead wire.

6. The flexible display panel according to claim 1, wherein the bendable region is a bending region.

7. The flexible display panel according to claim 1, wherein orthographic projection of the trench on the flexible base substrate overlaps the bendable region of the flexible base substrate.

8. The flexible display panel according to claim 1, wherein the trench is in a non-display region of the flexible display panel.

9. The flexible display panel according to claim 8, the flexible display panel further comprising a display region, wherein the display region is provided with an array of sub-pixels and signal lines, and the non-display region is provided with a driving chip.

10. The flexible display panel according to claim 1, wherein a thickness of the second layer in a direction perpendicular to the flexible base substrate is lower than a depth of the trench.

11. The flexible display panel according to claim 1, wherein the second layer is made from at least one material selected from the group consisting of polymethylmethacrylate, polydimethylsiloxane, polymethacrylate, polyimide, polyethylene terephthalate, photoresist, and mixtures thereof.

12. The flexible display panel according to claim 9, wherein thin film transistors are located in the array of the sub-pixels and each of the thin film transistors includes an isolation buffer layer, an active layer, a first gate insulation layer, a first gate layer, a second gate insulation layer, a second gate layer, a dielectric layer, a source/drain metal layer, and a planarization layer, and
   wherein the first layer includes at least one or more layers from the group consisting of the dielectric layer, the second gate insulating layer, the first gate insulating layer, the isolation buffer layer that cover the non-display region, and mixtures thereof.

13. The flexible display panel according to claim 12, wherein the metal layer and the source/drain metal layer are the same material.

14. The flexible display panel according to claim 12, wherein the second layer and the planarization layer are the same material.

15. A display apparatus, comprising the flexible display panel according to claim 1.

16. A method for fabricating a flexible display panel, the method comprising:
   providing a flexible base substrate, the flexible base substrate comprising a bendable region;
   forming a first layer on the flexible base substrate;
   forming a trench penetrating at least part of the first layer;
   filling a second layer in the trench;
   forming a metal layer on the second layer and the first layer; and
   forming a buffer layer on the metal layer;
   wherein the second layer has a smaller elastic modulus than the first layer;
   the trench includes a bottom surface, and a first side surface and a second side surface located on both sides of the bottom surface respectively and connected to the bottom surface;
   each of the first side surface and the second side surface comprises two sloped surfaces and a step surface between the two sloped surfaces, and an angle of each of the two sloped surfaces is less than 90 degrees; and
   the second layer covers the two sloped surfaces and the step surface to form a smooth side surface without a step in the trench, and the metal layer covers the smooth side surface in the trench.

17. The method for fabricating the flexible display panel according to claim 16, wherein the second layer is formed by an inkjet printing process.

* * * * *